United States Patent
Wu

(10) Patent No.: US 11,374,075 B2
(45) Date of Patent: Jun. 28, 2022

(54) BENDABLE DISPLAY PANEL AND BENDABLE DISPLAY DEVICE PROVIDED WITH THROUGH GROOVE IN BENDING DISPLAY REGION

(71) Applicant: WUHAN CHINA STAR OPTOELECTRONICS SEMICONDUCTOR DISPLAY TECHNOLOGY CO., LTD., Hubei (CN)

(72) Inventor: Shaojing Wu, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/754,843

(22) PCT Filed: Oct. 22, 2019

(86) PCT No.: PCT/CN2019/112419
§ 371 (c)(1),
(2) Date: Apr. 9, 2020

(87) PCT Pub. No.: WO2021/027060
PCT Pub. Date: Feb. 18, 2021

(65) Prior Publication Data
US 2021/0098547 A1 Apr. 1, 2021

(30) Foreign Application Priority Data
Aug. 15, 2019 (CN) .......................... 201910752328.1

(51) Int. Cl.
*H01L 27/32* (2006.01)
*H01L 51/00* (2006.01)

(52) U.S. Cl.
CPC ...... *H01L 27/3258* (2013.01); *H01L 27/3248* (2013.01); *H01L 27/3211* (2013.01); *H01L 51/0097* (2013.01); *H01L 2251/5338* (2013.01)

(58) Field of Classification Search
CPC ............ H01L 27/3258; H01L 27/3248; H01L 27/3211; H01L 51/0097; H01L 2251/5338
(Continued)

(56) References Cited

U.S. PATENT DOCUMENTS

2015/0340652 A1  11/2015  Oh
2017/0133449 A1*  5/2017  Kim ...................... H01L 27/326
(Continued)

FOREIGN PATENT DOCUMENTS

CN  109166866 A  1/2019
CN  109461742 A  3/2019
(Continued)

*Primary Examiner* — Xia L Cross
(74) *Attorney, Agent, or Firm* — The Roy Gross Law Firm, LLC; Roy Gross

(57) ABSTRACT

The present application provides a display panel and a display device. The display panel includes a plurality of first pixel circuits located in a bending display region and a plurality of second pixel circuits located in a non-bending display region, a first gap is defined between two adjacent first pixel circuits, a second gap is defined between two adjacent second pixel circuits, a width of the first gap is greater than a width of the second gap, and at least one through groove is formed in a region corresponding to the first gap and extends along an extending direction of the first gap.

14 Claims, 3 Drawing Sheets

(58) Field of Classification Search
USPC .................................................. 257/40, 72
See application file for complete search history.

(56) References Cited

U.S. PATENT DOCUMENTS

| | | | |
|---|---|---|---|
| 2019/0115407 A1* | 4/2019 | Cho | .................... H01L 27/3262 |
| 2019/0157312 A1* | 5/2019 | Lee | .................... H01L 51/0097 |
| 2019/0259967 A1 | 8/2019 | Yang | |
| 2019/0363267 A1 | 11/2019 | Tanaka et al. | |
| 2019/0371866 A1* | 12/2019 | Kim | ....................... G02B 5/201 |
| 2020/0410910 A1 | 12/2020 | Jia et al. | |

FOREIGN PATENT DOCUMENTS

| | | | |
|---|---|---|---|
| CN | 109686758 A | 4/2019 | |
| CN | 109830184 A | 5/2019 | |
| CN | 109994536 A | 7/2019 | |
| WO | 2018198262 A1 | 11/2018 | |

* cited by examiner

BENDABLE DISPLAY PANEL AND BENDABLE DISPLAY DEVICE PROVIDED WITH THROUGH GROOVE IN BENDING DISPLAY REGION

BACKGROUND OF INVENTION

Field of Invention

The present application relates to the display field, and particularly to a display panel and a display device.

Description of Prior Art

Active-matrix organic light-emitting diode (AMOLED) display panel has gradually become a new generation display technology for its high contrast, wide color gamut, and low power consumption.

In present AMOLED display panels, due to a greater number of inorganic film layers with poor bending resistance, it is difficult to release stress in the inorganic film layers during the bending process, resulting in fractures or cracks in the inorganic film layers, and the cracks easily extend along the inorganic film layers, which damage the entire display panel and affect display effect of the display panel.

SUMMARY OF INVENTION

In present AMOLED display panels, due to a greater number of inorganic film layers with poor bending resistance, it is difficult to release stress in the inorganic film layers during the bending process, resulting in fractures or cracks in the inorganic film layers, and the cracks easily extend along the inorganic film layers, which damage the entire display panel and affect display effect of the display panel.

The present application provides a display panel and a display device to improve the bending resistance of the display panel and the display device.

Firstly, the present application provides a display panel, the display panel comprises a bending display region and a non-bending display region; the display panel comprises a plurality of first pixel circuits located in the bending display region and a plurality of second pixel circuits located in the non-bending display region, a first gap is defined between the adjacent two first pixel circuits, and a second gap is defined between the adjacent two second pixel circuits, and a width of the first gap is greater than a width of the second gap, and at least one through groove is formed in the region corresponding to the first gap and extends along an extending direction of the first gap.

In the display panel of the present application, the display panel located in the bending display region comprises a substrate layer, and a source drain electrode layer, a first insulating layer, a gate electrode layer and a second insulating layer sequentially stacked on the substrate layer, the through groove penetrates through the first insulating layer and the second insulating layer of the first gap of the bending display region.

In the display panel of the present application, the gate electrode layer comprises a upper gate electrode layer and a lower gate electrode layer, the second insulating layer comprises a first sublayer and a second sublayer, the lower gate electrode layer, the first sublayer, the upper gate electrode layer, and the second sublayer are sequentially stacked on the first insulating layer, the through groove penetrates through the first insulating layer, the first sublayer and the second sublayer of the first gap of the bending display region.

In the display panel of the present application, the display panel located in the bending display region further comprises:

a first source drain electrode metal layer formed along a surface of the second insulating layer and an inner surface of the through groove, and electrically connected to the source drain electrode layer.

In the display panel of the present application, the display panel located in the bending display region further comprises:

a first planarization layer formed on the surface of the second insulating layer and the first source drain electrode metal layer, and filling the through groove.

In the display panel of the present application, the display panel located in the bending display region further comprises:

an organic layer, wherein the organic layer is formed on the second insulating layer, and filling the through groove.

In the display panel of the present application, the display panel located in the bending display region further comprises:

a second source drain electrode metal layer, wherein the second source drain electrode metal layer is formed on the organic layer, and electrically connected to the source drain electrode layer; and a second planarization layer, wherein the second planarization layer is formed on the organic layer and the second source drain electrode metal layer.

In the display panel of the present application, an extending direction of the through groove is different from a bending direction of the display panel.

In the display panel of the present application, the extending direction of the through groove is perpendicular to the bending direction of the display panel, and the width of the first gap is greater than or equal to 10 micrometers.

In the display panel of the present application, the substrate layer comprises a base layer, a shielding layer, and a buffer layer sequentially stacked.

Secondly, the present application provides a display device, the display panel comprises a bending display region and a non-bending display region; the display panel comprises a plurality of first pixel circuits located in the bending display region and a plurality of second pixel circuits located in the non-bending display region, a first gap is defined between the adjacent two first pixel circuits, and a second gap is defined between the adjacent two second pixel circuits, and a width of the first gap is greater than a width of the second gap, and at least one through groove is formed in the region corresponding to the first gap and extends along an extending direction of the first gap.

In the display panel of the present application, the display panel comprises a substrate layer, and a source drain electrode layer, a first insulating layer, a gate electrode layer and a second insulating layer sequentially stacked on the substrate layer, the through groove penetrates through the first insulating layer and the second insulating layer of the first gap of the bending display region.

In the display panel of the present application, the gate electrode layer comprises a upper gate electrode layer and a lower gate electrode layer, the second insulating layer comprises a first sublayer and a second sublayer, the lower gate electrode layer, the first sublayer, the upper gate electrode layer, and the second sublayer are sequentially stacked on the first insulating layer, the through groove penetrates through the first insulating layer, the first sublayer and the second sublayer of the first gap of the bending display region.

In the display panel of the present application, the display panel located in the bending display region further comprises:

a first source drain electrode metal layer formed along a surface of the second insulating layer and an inner surface of the through groove, and electrically connected to the source drain electrode layer.

In the display panel of the present application, the display panel located in the bending display region further comprises:

a first planarization layer formed on the surface of the second insulating layer and the first source drain electrode metal layer, and filling the through groove.

In the display panel of the present application, the display panel located in the bending display region further comprises:

an organic layer, wherein the organic layer is formed on the second insulating layer, and filling the through groove.

In the display panel of the present application, the display panel located in the bending display region further comprises:

a second source drain electrode metal layer, wherein the second source drain electrode metal layer is formed on the organic layer, and electrically connected to the source drain electrode layer; and a second planarization layer, wherein the second planarization layer is formed on the organic layer and the second source drain electrode metal layer.

In the display panel of the present application, an extending direction of the through groove is different from a bending direction of the display panel.

In the display panel of the present application, the extending direction of the through groove is perpendicular to the bending direction of the display panel, and the width of the first gap is greater than or equal to 10 micrometers.

In the display panel of the present application, the substrate layer comprises a base layer, a shielding layer, and a buffer layer sequentially stacked.

The beneficial effect is: the display panel of the present application includes a bending display region and non-bending display region; the display panel comprises a plurality of first pixel circuits located in the bending display region and a plurality of second pixel circuits located in the non-bending display region, a first gap is defined between the two adjacent first pixel circuits, and a second gap is defined between the two adjacent second pixel circuits, and a width of the first gap is greater than a width of the second gap, and at least one through groove is formed in the region corresponding to the first gap and extends along an extending direction of the first gap. The present solution can improve the bending resistance of the display panel.

DETAILED DESCRIPTION OF PREFERRED EMBODIMENTS

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

Figure 1:
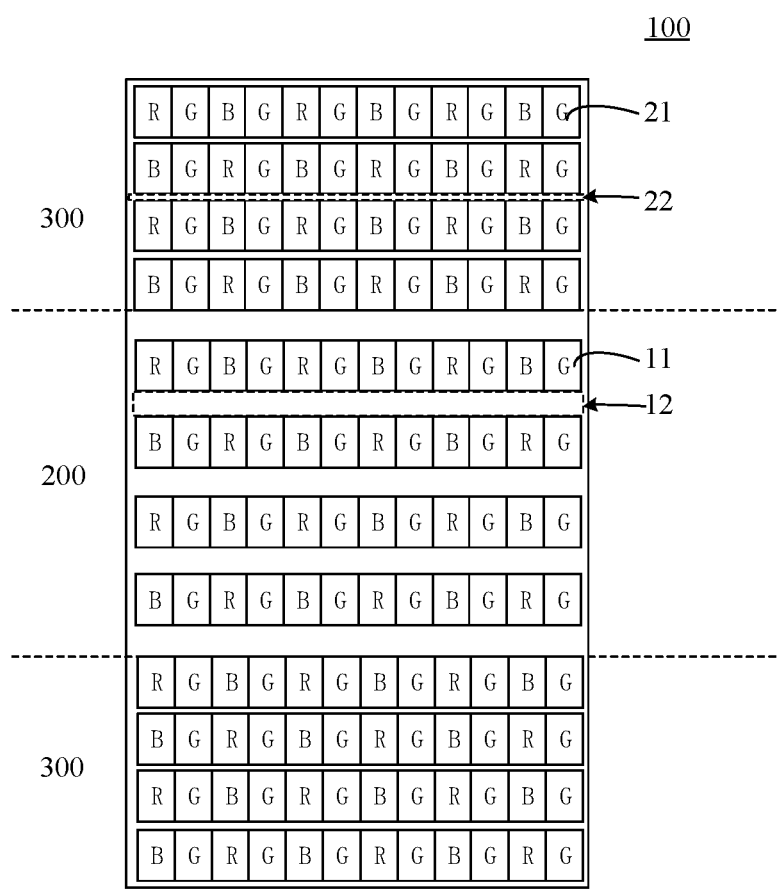
FIG. 1 is a schematic view of a display panel of the present disclosure.

Referring to FIG. 1, FIG. 1 is a schematic view of a display panel of the present disclosure. The display panel 100 can include a bending display region 200 and a non-bending display region 300. The display panel 100 can include a plurality of first pixel circuits 11 located in the bending display region 200 and a plurality of second pixel circuits 21 located in the non-bending display region 300. A first gap 12 is defined between the two adjacent first pixel circuits 11, and a second gap 22 is defined between the two adjacent second pixel circuits 21.

In one exemplary embodiment, the bending display region 200 of the display panel 100 can be stretched to a certain extent along a direction perpendicular to a bending line, so that the first gap 12 between the two adjacent first pixel circuits 11 is greater than a preset value. The preset value is 10 micrometers. It should be noted that the preset value is obtained by person skilled in the art after many experiments. When the preset value is at least 10 micrometers, the structural design of the stress releasing in the first gap 12 can be ensured to facilitate the stress releasing of the first gap 12 when bending. The stretched first gap 12 can be more advantageous for releasing stress during bending, preventing breakage, improving the bending resistance of the display panel 100, and further improving the display stability of the display panel 100. It can be understood that a width of the first gap 12 between the two adjacent first pixel circuits 11 after stretching is greater than a width of the second gap 22 between the two adjacent second pixel circuits 21.

Figure 2:
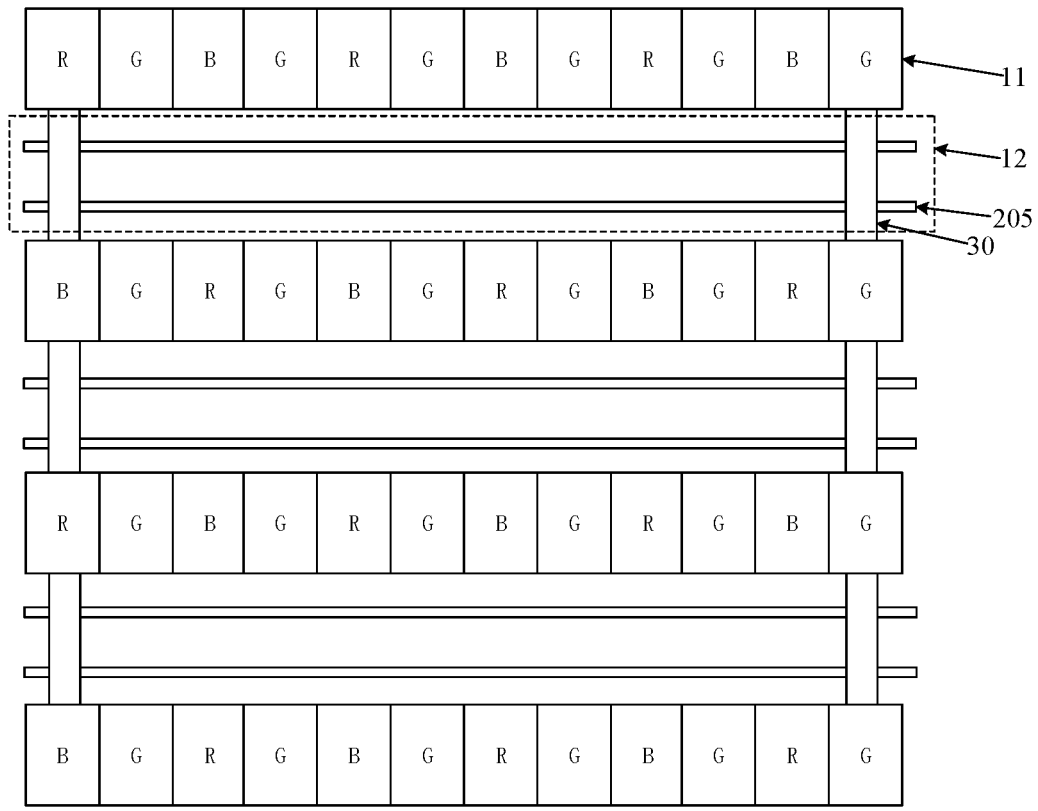
FIG. 2 is a schematic view of a bending display region of a display panel of the present disclosure.

Referring to FIG. 2, FIG. 2 is an optimized solution based on the above embodiment. In the present embodiment, the region corresponding to the first gap 12 grooves along an extending direction of the first gap 12 to form at least one through groove 205. It can be understood that an extending direction of the through groove 205 is perpendicular to a bending direction of the display panel 100. It should be noted that the two adjacent first pixel circuits 11 can be electrically connected to a source drain electrode metal layer 30. The through groove 205 can prevent a large amount of stress generated during the bending of the first gap 12 from accumulating, reduce the probability of fracture, improve the bending resistance of the first gap 12, and further realize the bending resistance of the display panel 100.

In order to illustrate the above embodiments in detail, the embodiment of the present application provides a schematic view of a film layer of the bending display region 200 of the display panel 100.

Figure 3:
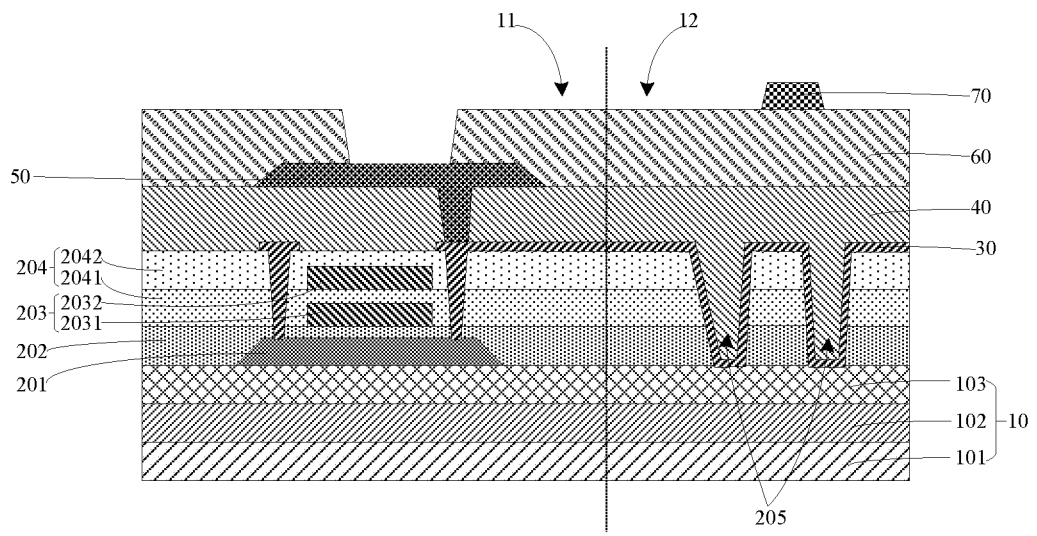
FIG. 3 is a film layer schematic view of a bending display region of a display panel of the present disclosure.
Figure 4:
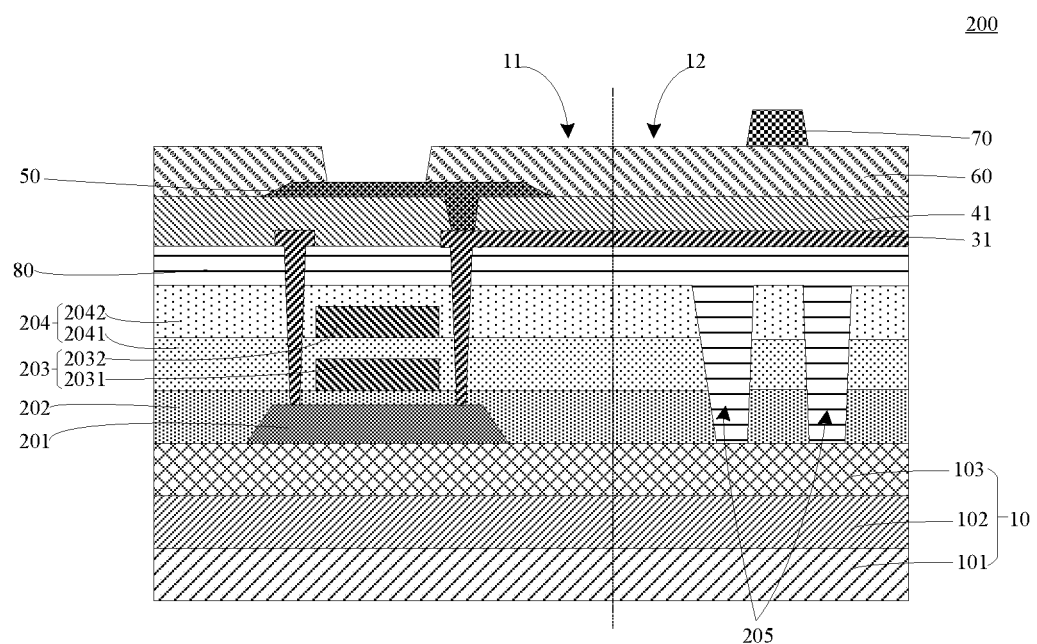
FIG. 4 is another film layer schematic view of a bending display region of a display panel of the present disclosure.

Referring to FIG. 3 or FIG. 4, the display panel 100 located in the bending display region 200 includes a substrate layer 10, and a source drain electrode layer 201, a first insulating layer 202, a gate electrode layer 203, and a second insulating layer 204 sequentially stacked on the substrate layer 10. The bending display region 200 can include a plurality of first pixel circuits 11 and a plurality of first gap 12.

The substrate layer 10 includes a base layer 101, a shielding layer 102, and a buffer layer 103. The shielding layer 102 and the buffer layer 103 are sequentially stacked on the base layer 101.

The base layer 101 is made of any insulating material with a flexible feature. For example, the base layer 101 can be made of polymer materials, such as polyimide (PI), polycarbonate (PC), polyethersulfone (PES), polyethylene terephthalate (PET), polyethylene naphthalate (PEN), polyarylate (PAR), glass fiber reinforced plastic (FRP), etc. The base layer 101 can be a transparent, translucent or opaque base.

The shielding layer 102 can be made of metal materials. For example, gold (Au), silver (Ag), copper (Cu), nickel (Ni), platinum (Pt), palladium (Pd), aluminum (Al), molybdenum (Mo), chromium (Cr), etc., alloys such as aluminum (Al): niobium (Nd) alloy or molybdenum (Mo): tungsten (W) alloy, etc.

The buffer layer 103 covers the shielding layer 102. The buffer layer 103 can be a single layer or a multilayer structure for blocking oxygen and moisture, preventing moisture or impurities from diffusing through the shielding layer 102 and the base layer 101, and providing a flat surface for the shielding layer 102. In the present embodiment, the buffer layer 103 can be a film layer made from inorganic material such as silicon oxide (SiOx), silicon nitride (SiNx), silicon oxynitride (SiOxNy), aluminum oxide (AlOx), or aluminum nitride (AlNx).

The source drain electrode layer 201 can be formed by changing amorphous silicon to polysilicon by crystallizing the amorphous silicon. Specifically, in order to crystallize amorphous silicon, rapid thermal annealing (RTA), solid phase crystallization (SPC), excimer laser annealing (ELA), metal induced crystallization (MIC), metal induced lateral crystallization (MILC), or continuous transverse solidification (SLS) can be applied.

The first insulating layer 202 can be made of an inorganic material such as silicon oxide, silicon nitride, or metal oxide, and can include a single layer or a plurality of film layers.

The gate electrode layer 203 can be made of a metal material. For example: gold (Au), silver (Ag), copper (Cu), nickel (Ni), platinum (Pt), palladium (Pd), aluminum (Al), molybdenum (Mo) or chromium (Cr), etc., or alloys such as aluminum (Al): niobium (Nd) alloy, molybdenum (Mo): tungsten (W) alloy, etc.

The second insulating layer 204 can be made of an organic material, and can include a single layer or a plurality of film layers.

In some embodiments, the gate electrode layer 203 can include a lower gate electrode layer 2031 and an upper gate electrode layer 2032. The second insulating layer 204 can include a first sublayer 2041 and a second sublayer 2042. The lower gate electrode layer 2031 is formed on the first insulating layer 202. The first sublayer 2041 covers the lower gate electrode layer 2031 and the first insulating layer 202. The upper gate electrode layer 2032 is formed on the first sublayer 2041. The second sublayer 2042 covers the upper gate electrode layer 2032 and the first sublayer 2041.

In some embodiments, in order to improve the bending resistance of the bending display region 200, a plurality of through grooves 205 can be formed in the first gaps 12 of the bending display region 200. The through grooves 205 can prevent a large amount of stress generated by bending the first gap 12 from accumulating, reducing the probability of breakage.

It should be noted that the extending direction of the through groove 205 is perpendicular to the bending direction of the display panel 100. That is, the through groove 205 penetrates through the first insulating layer 202 and the second insulating layer 204 of the first gap 12 located in the bending display region 200. Specifically, the through groove 205 penetrates through the first insulating layer 202 of the first gap 12, and the first sublayer 2041 and the second sublayer 2042 of the second insulating layer 204 located in the bending display region 200.

It should be noted that in the description of the present application, the terms "first", "second", and "third" are used for descriptive purposes only, and are not to be construed as indicating or implying relative importance or implicit indication of the indicated number of technical features. Thus, features defining "first", "second", and "third" may include one or more of the described features either explicitly or implicitly.

In some embodiments, referring to FIG. 3, the display panel 100 further includes a first source drain electrode metal layer 30 and a first planarization layer 40 in the bending display region 200.

The source drain electrode metal layer 30 is formed along a surface of the first insulating layer 204 and an inner surface of the through groove 205. Specifically, by covering the source drain electrode metal layer 30 onto the inner surface of the through groove 205 and the surface of the second insulating layer 204, the source drain electrode metal layer 30 is a wave shape, which facilitates the bending of the source drain electrode metal layer 30, reducing the probability of breakage occurring during the source drain electrode metal layer 30 bending. In some embodiments, the first source drain electrode metal layer 30 is made of metal material with a good bending performance. For example, titanium (Ti), aluminum (Al), or alloys thereof.

The first planarization layer 40 can be formed on the surface of the second insulating layer 204 and the first source drain electrode layer metal 30, and fills the through groove 205. The first planarization layer 40 can be made of organic materials.

In some embodiments, referring to FIG. 4, the display panel 100 located in the bending display region 200 further includes a second source drain electrode metal layer 31, a second planarization layer 41, and an organic layer 80.

The organic layer 80 can be formed on the second insulating layer 204. It should be noted that the organic layer 80 fills the through groove 205. As the display panel 100 is bending, the organic layer 80 can release the stress generated when the bending display region 200 is bending, improve the bending resistance of the bending display region 200, and reduce breakage probability of the bending display region 200 when bending.

The second source drain electrode metal layer 31 can be formed on the organic layer 80. Moreover, the second source drain electrode metal layer 31 can be electrically connected to the source drain electrode layer 201 through a through hole. The second source drain electrode metal layer 31 can be made of metal material with a good bending performance. For example, titanium (Ti), aluminum (Al) or alloys thereof.

The second planarization layer 41 is formed on the organic layer 80 and the second source drain electrode metal layer 31.

From the above, in the present embodiment, because the organic layer 80 is formed between the second planarization layer 41 and the second source drain electrode metal layer 31, the organic layer 80 can effectively buffer the stress generated when the second planarization layer 41 and the second source drain electrode metal layer 31 are bending, which reduces the probability of breakage of the second source drain electrode metal layer 31 when bending.

Referring to FIG. 3 or FIG. 4, the display panel 100 located in the bending display region 200 further includes an anode layer 50, a pixel defining layer 60, and an organic supporting layer 70.

The anode layer 50 can be formed on the first flatteding layer 40 and electrically connected to the first source drain electrode metal layer 30. Alternatively, the anode layer 50 can be formed on the second planarization layer 41 and electrically connected to the second source drain electrode metal layer 31. The anode layer 50 can be made of various conductive materials. For example, the anode layer 50 can be formed as a transparent electrode or a reflective electrode depending on its use.

The pixel defining layer 60 covers the anode layer 50 and the first planarization layer 40. Alternatively, the pixel defining layer 60 is formed on the anode layer 50 and the second planarization layer 41. The pixel defining layer 60 can be made of an organic material.

The organic supporting layer 70 is formed on the pixel defining layer 60. The organic support layer 70 mainly supports the display bending region 200.

In summary, the bending display region 200 of the display panel 100 of the embodiment of the present application is disposed with a plurality of through grooves 205 penetrating through the first insulating layer 202 and the second insulating layer 204 in the first gap 12, so that large amount of stress generated in the first gap 12 during bending cannot be accumulated, the probability of breakage is reduced, the bending resistance of the first gap 12 is improved, and the bending resistance of the bending display region 200 is further improved, thereby improving the bending resistance of the display panel 100.

The embodiment of the present application also provides a display device. It should be noted that the display device 1000 includes the display panel 100 in the above embodiment.

In the above embodiments, the descriptions of the various embodiments are different, and the details that are not detailed in a certain embodiment can be referred to the related descriptions of other embodiments.

A display panel and a display device of the embodiments of the present application have been described in detail above. The principles and implementations of the present application are described in the specific examples. The description of the foregoing embodiments is only for helping to understand the technical solutions of the present application and the core ideas thereof. A person skilled in the art should understand that the technical solutions described in the foregoing embodiments may be modified or equivalently replaced in some of the technical features; and the modifications or substitutions do not depart from the scope of the technical solutions of the embodiments of the present application.

What is claimed is:

1. A display panel, wherein the display panel comprises a bending display region and a non-bending display region; and the display panel comprises a plurality of first pixel circuits located in the bending display region and a plurality of second pixel circuits located in the non-bending display region, a first gap is defined between two adjacent first pixel circuits, a second gap is defined between two adjacent second pixel circuits, a width of the first gap is greater than a width of the second gap, and at least one through groove is formed in a region corresponding to the first gap and extends along an extending direction of the first gap;

wherein the bending display region comprises a substrate layer, and a source drain electrode layer, a first insulating layer, a gate electrode layer, a second insulating layer, a first source drain electrode metal layer, a pixel defining layer, and an organic supporting layer sequentially stacked on the substrate layer;

wherein the plurality of first pixel circuits in two adjacent rows are electrically connected through the first source drain electrode metal layer;

wherein the at least one through groove penetrates through the first insulating layer and the second insulating layer of the first gap of the bending display region;

wherein in the bending display region, the first source drain electrode metal layer is disposed along a surface of the second insulating layer and an inner surface of the at least one through groove and electrically connected to the source drain electrode layer; and wherein the organic supporting layer is disposed on the pixel defining layer and overlaps the first source drain electrode metal layer in a plan view in the bending display region.

2. The display panel of claim 1, wherein the gate electrode layer comprises an upper gate electrode layer and a lower gate electrode layer, the second insulating layer comprises a first sublayer and a second sublayer, the lower gate electrode layer, the first sublayer, the upper gate electrode layer, and the second sublayer are sequentially stacked on the first insulating layer, and the at least one through groove penetrates through the first insulating layer, the first sublayer, and the second sublayer of the first gap of the bending display region.

3. The display panel of claim 1, wherein the display panel located in the bending display region further comprises:
a first planarization layer formed on the surface of the second insulating layer and the first source drain electrode metal layer, and filling the at least one through groove.

4. The display panel of claim 1, wherein the display panel located in the bending display region further comprises:
an organic layer, wherein the organic layer is formed on the second insulating layer, and fills the at least one through groove.

5. The display panel of claim 1, wherein an extending direction of the at least one through groove is different from a bending direction of the display panel.

6. The display panel of claim 5, wherein the extending direction of the at least one through groove is perpendicular to the bending direction of the display panel, and the width of the first gap is greater than or equal to 10 micrometers.

7. The display panel of claim 1, wherein the substrate layer comprises a base layer, a shielding layer, and a buffer layer sequentially stacked.

8. A display device, comprising a display panel, wherein the display panel comprises a bending display region and a non-bending display region; and the display panel comprises a plurality of first pixel circuits located in the bending display region and a plurality of second pixel circuits located in the non-bending display region, a first gap is defined between two adjacent first pixel circuits, a second gap is defined between two adjacent second pixel circuits, a width of the first gap is greater than a width of the second gap, and at least one through groove is formed in a region corresponding to the first gap and extends along an extending direction of the first gap;

wherein the bending display region comprises a substrate layer, and a source drain electrode layer, a first insulating layer, a gate electrode layer, a second insulating layer, a first source drain electrode metal layer, a pixel defining layer, and an organic supporting layer sequentially stacked on the substrate layer;

wherein the plurality of first pixel circuits in two adjacent rows are electrically connected through the first source drain electrode metal layer;

wherein the at least one through groove penetrates through the first insulating layer and the second insulating layer of the first gap of the bending display region;

wherein in the bending display region, the first source drain electrode metal layer is disposed along a surface of the second insulating layer and an inner surface of the at least one through groove and electrically connected to the source drain electrode layer; and wherein the organic supporting layer is disposed on the pixel defining layer and overlaps the first source drain electrode metal layer in a plan view in the bending display region.

9. The display device of claim 8, wherein the gate electrode layer comprises an upper gate electrode layer and a lower gate electrode layer, the second insulating layer comprises a first sublayer and a second sublayer, the lower gate electrode layer, the first sublayer, the upper gate electrode layer, and the second sublayer are sequentially stacked on the first insulating layer, and the at least one through groove penetrates through the first insulating layer, the first sublayer, and the second sublayer of the first gap of the bending display region.

10. The display device of claim 8, wherein the display panel located in the bending display region further comprises:
a first planarization layer formed on the surface of the second insulating layer and the first source drain electrode metal layer, and filling the at least one through groove.

11. The display device of claim 8, wherein the display panel located in the bending display region further comprises:
an organic layer, wherein the organic layer is formed on the second insulating layer, and fills the at least one through groove.

12. The display device of claim 8, wherein an extending direction of the at least one through groove is different from a bending direction of the display panel.

13. The display device of claim 12, wherein the extending direction of the at least one through groove is perpendicular to the bending direction of the display panel, and the width of the first gap is greater than or equal to 10 micrometers.

14. The display device of claim 8, wherein the substrate layer comprises a base layer, a shielding layer, and a buffer layer sequentially stacked.

* * * * *